(12) United States Patent
Kohsiek

(10) Patent No.: US 6,861,893 B2
(45) Date of Patent: Mar. 1, 2005

(54) CIRCUIT ARRANGEMENT FOR A CURRENT-CONTROLLED RESISTOR HAVING AN ENLARGED LINEAR RANGE

(75) Inventor: Cord-Heinrich Kohsiek, Ellerau (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/369,943

(22) Filed: Feb. 19, 2003

(65) Prior Publication Data

US 2003/0227318 A1 Dec. 11, 2003

(30) Foreign Application Priority Data

Feb. 22, 2002 (DE) .......................... 102 07 676

(51) Int. Cl.$^7$ ............................................. H03K 17/74
(52) U.S. Cl. .................... 327/494; 327/504; 327/583
(58) Field of Search ................... 327/103, 308, 327/330, 493, 494, 499, 500, 504, 505, 583, 585, 587

(56) References Cited

U.S. PATENT DOCUMENTS

| | | | | |
|---|---|---|---|---|
| 4,209,711 A | * | 6/1980 | Baker | 307/104 |
| 4,885,545 A | * | 12/1989 | Sanielevici | 327/92 |
| 5,640,120 A | * | 6/1997 | Wiest et al. | 327/334 |
| 5,745,003 A | * | 4/1998 | Wakimoto et al. | 327/382 |
| 6,424,201 B2 | * | 7/2002 | Yamamoto et al. | 327/502 |
| 6,639,397 B2 | * | 10/2003 | Roth et al. | 324/158.1 |
| 6,717,450 B1 | * | 4/2004 | Linder | 327/321 |

* cited by examiner

Primary Examiner—Tuan T. Lam
(74) Attorney, Agent, or Firm—Michael J. Wre

(57) ABSTRACT

The invention relates to a circuit arrangement for a current-controlled resistor having an enlarged linear range, using an arrangement of non-linear bipolar load elements wherein the resistance is generated between a first terminal (E) and a second terminal (F), having at least one control terminal (X) that is fed by a supply current source (I1), wherein the arrangement of the non-linear bipolar load elements comprises at least a third chain (C) comprising one or more of the load elements ($D_{C1}$ ... $D_{Ci}$), the load elements being connected in series where there is more than one of them, and comprises a first chain (A) and a second chain (B) each comprising one or more load elements ($D_{A1}$ ... $D_{Aj}$ and $D_{B1}$ ... $D_{Bk}$ respectively), the load elements again being connected in series where there is more than one of them in either of the chains (A, B), the second and the third chain (A, B) have a common point of connection (Y) to the first chain (C) and a further common point of connection (Z) to one another, which further common point of connection (Z) is connected to a fourth chain (D) of non-linear bipolar load elements ($D_{D1}$ ... $D_{Dl}$), the first resistor terminal (E) is connected directly or indirectly to the first chain (A) and the second chain (B) is connected directly or indirectly to the second resistor terminal (F) and directly or indirectly to the third and the fourth chain (C, D) as well.

11 Claims, 10 Drawing Sheets

CIRCUIT ARRANGEMENT FOR A CURRENT-CONTROLLED RESISTOR HAVING AN ENLARGED LINEAR RANGE

The invention relates to a circuit arrangement for a current-controlled resistor having an enlarged linear range.

Diodes whose internal resistance is controlled by current are used in bipolar integrated circuits as controllable resistors. The disadvantage they have is their limited linearity.

The use of diodes as load resistors is known from DE 43 20 006 C2. In this case, terminals of the diodes are connected together at a point of connection and are fed with current via this point of connection. The point of connection is connected to the input of a regulating member whose output is connected to the interconnected control inputs of the controllable current sources supplying the other terminals of the diodes, the currents from the current sources being controlled in such a way that a constant potential is established at the input of the regulating member. Nothing is done to linearize the resistance of the resistor arrangement, which is determined essentially by the differential resistance of the diodes.

It is, therefore, an object to provide a current-controlled resistor of high linearity that can be produced in bipolar technology.

This object is achieved by a circuit arrangement as claimed in claim 1.

In accordance with the invention, a circuit arrangement is proposed for a current-controlled resistor having an enlarged linear range, using an arrangement of non-linear bipolar load elements wherein the resistance is generated between a first and a second terminal, having a first resistor terminal, a second resistor terminal, a first control terminal that is fed by a control current source, and a second control terminal, wherein the arrangement of the non-linear bipolar load elements comprises a plurality of chains comprising one or more of the load elements, the two center chains are formed by two parallel chains of load elements, one resistor terminal is located directly or indirectly at the center of each of the parallel chains, the two control terminals are situated at the beginning and the end of the arrangement and the control terminals have a low-resistance connection to one of the resistor terminals.

The signal current through the resistor is made up of three components which, when summed, produce the linearization as a result of opposing curvatures compensating for one another.

It becomes possible in this way to obtain a linear resistor that is controllable over a wide range and whose conductance is proportional to the control current.

The physical properties of the non-linear bipolar load elements in a chain may all be the same, which makes things simpler from the point of view of manufacture; it is not absolutely necessary, however. Physical properties of the diodes include their structure, i.e. their area factor. It is also possible for the physical properties of the load elements to be the same in all the chains. The number of load elements in each of the chains is selected independently of their physical properties. The first or the second chain may comprise a plurality of sub-chains, these sub-chains being connected in parallel with one another.

A possible non-linear bipolar load element is a semiconductor diode or a transistor diode.

The invention is intended for use in gain control, or as a PIN diode, a modulator or a multiplier.

These and other aspects of the invention are apparent from and will be elucidated with reference to the embodiments described hereinafter.

In the drawings, the following Figures serve to illustrate the derivation of the invention:

Figure 2A:
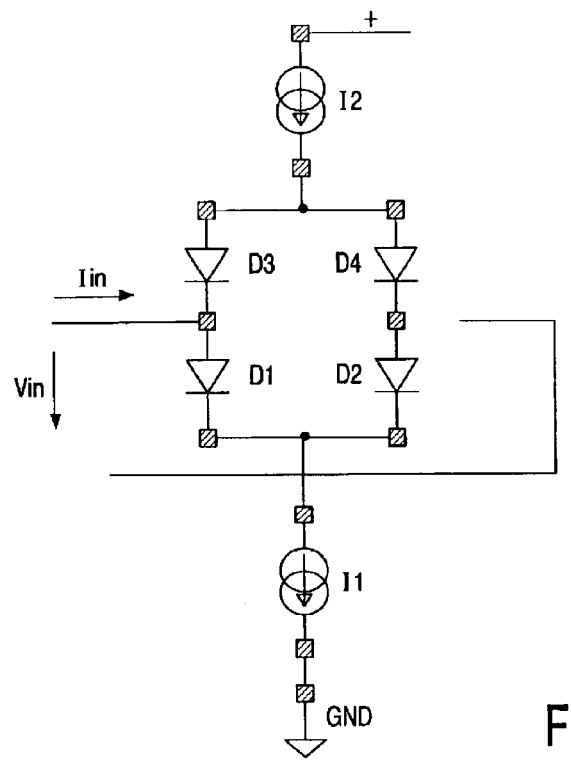
FIG. 2 shows a diode arrangement that is enlarged in comparison with that shown in FIG. 1(a) in part (a), the associated characteristic in part (b), and the dependence of resistance on the voltage in part (c).
Figure 4A:
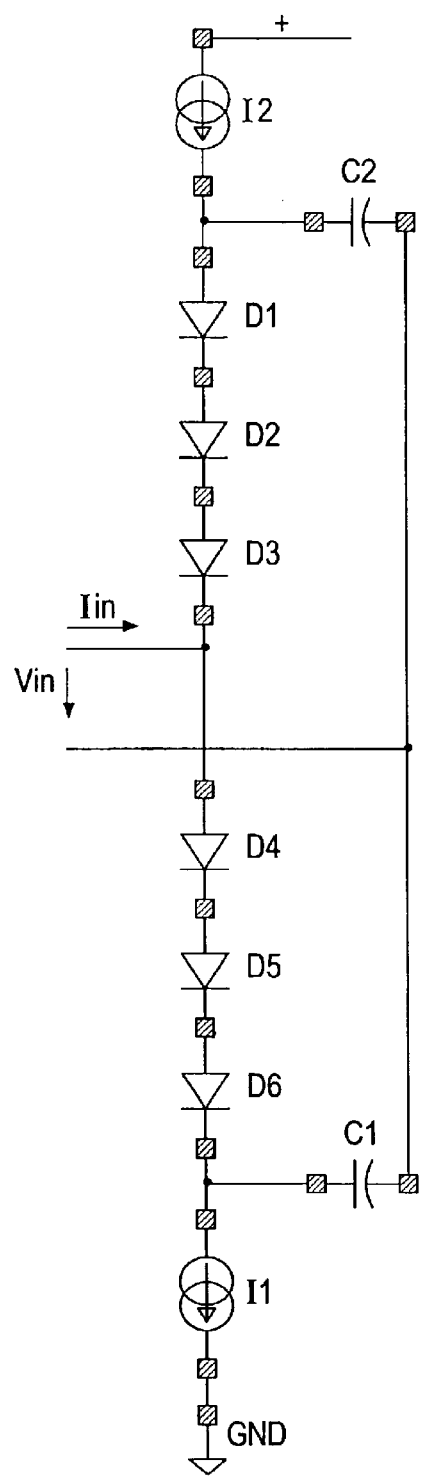
FIG. 4 shows a circuit having a diode chain in part (a), the characteristic in part (b), and the dependence of the resistance on the voltage in part (c).

The following Figures serve to elucidate the invention:

FIG. 5 shows a combination of the circuits of FIGS. 2(a) and 4(a) in part (a), the associated characteristic in part (b), and the dependence of the resistance on the voltage in part (c).

Figure 6:
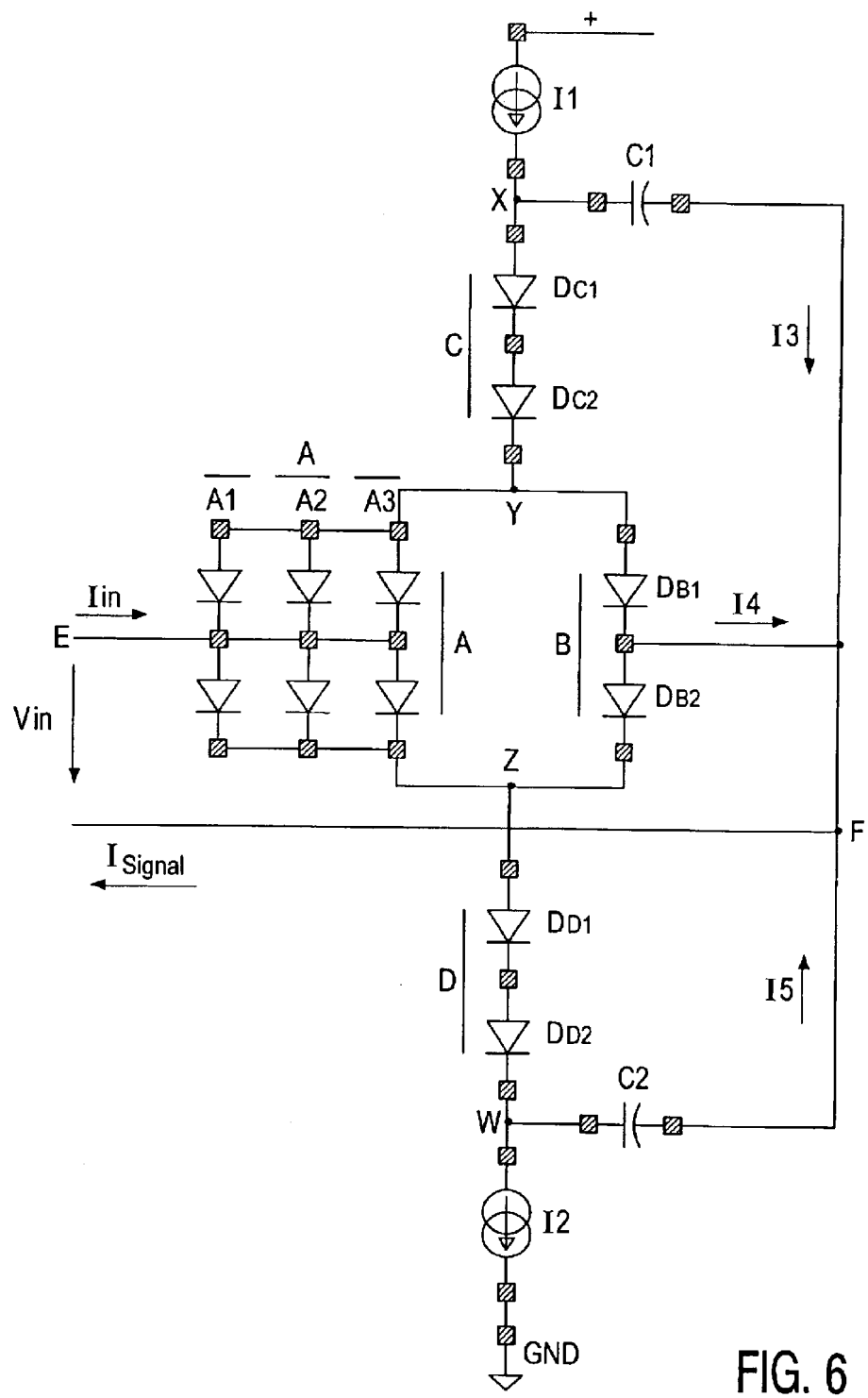

FIG. 6 shows a further diode arrangement according to the present invention having a plurality of parallel sub-chains.

Figure 7:
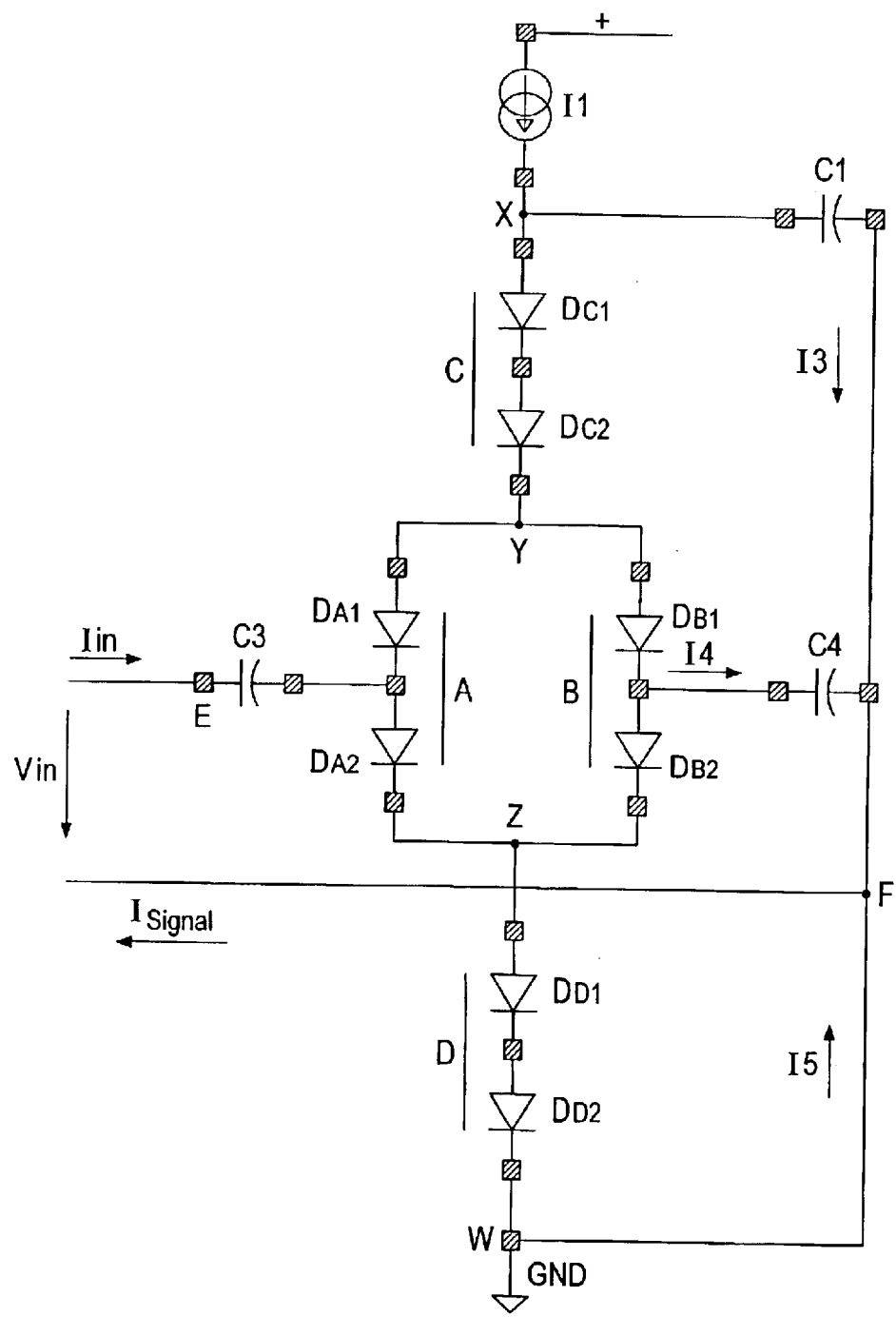

FIG. 7 shows a further diode arrangement according to the present invention but produced with only one control current source.

In what follows, what are described as the non-linear bipolar load elements are semiconductor diodes but use could equally well be made of transistor diodes.

Figure 1A:
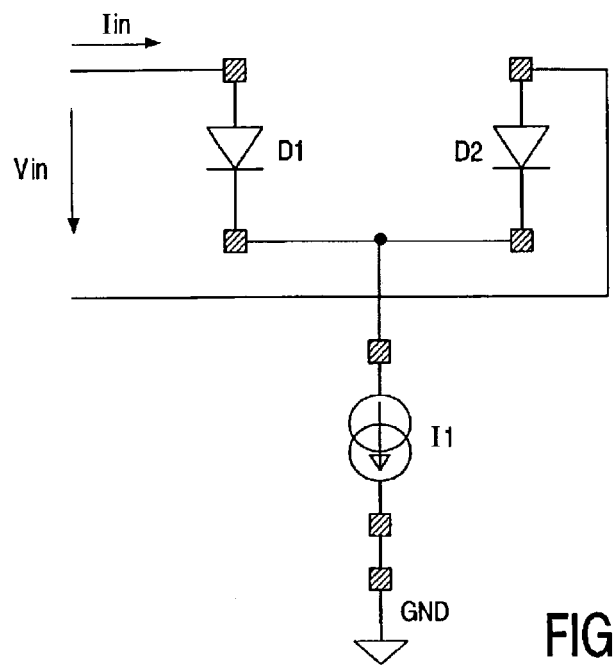
FIG. 1 shows a diode arrangement operating as a differential amplifier in part (a) and the associated characteristic in part (b).
Figure 1B:
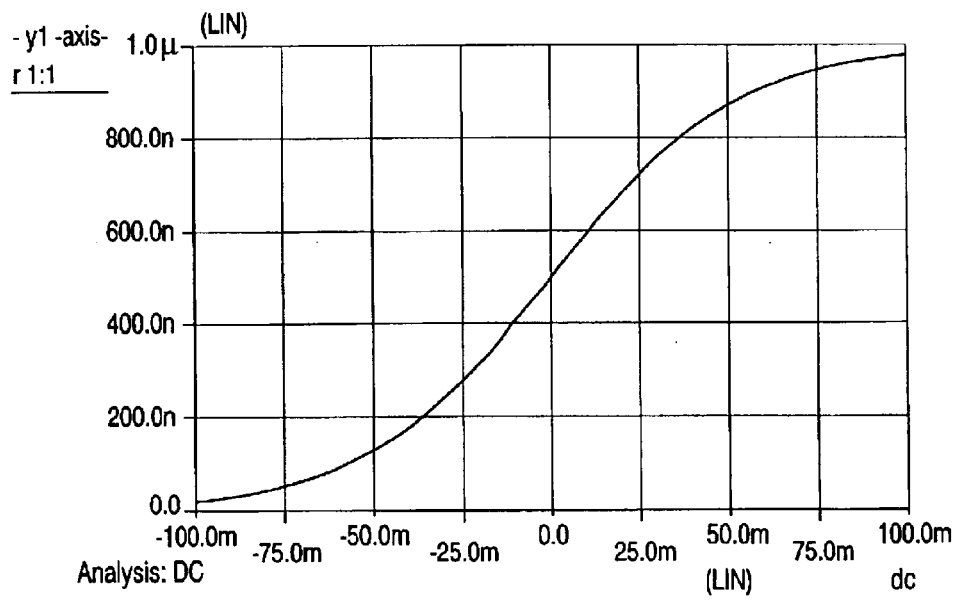

In FIG. 1, two diodes D1, D2 are fed by a current source I1 that is situated at the common point of connection of the two diodes D1, D2, which are connected back to back. Also applied to diodes D1 and D2 is a signal voltage Vin that generates the input current Iin. This diode arrangement produces the characteristic known for a differential amplifier, as shown in FIG. 1(b).

Figure 2B:
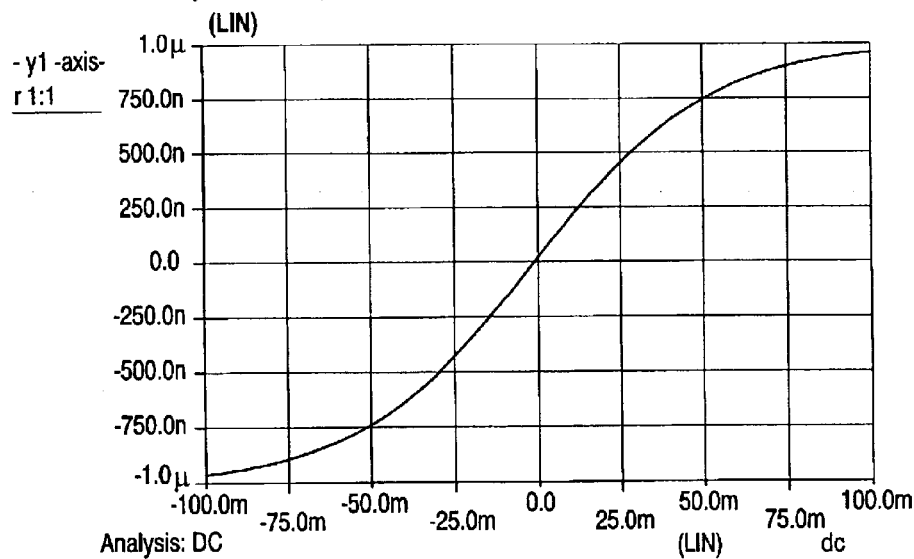
Figure 2C:
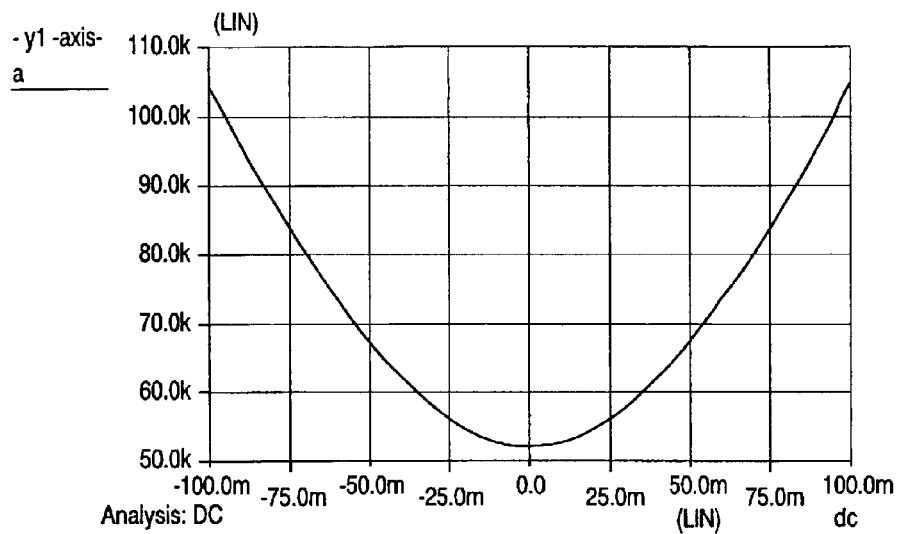

FIG. 2(a) shows an enlarged version of the diode arrangement of FIG. 1(a) in which two further diodes D3 and D4 are so connected that they form chains with the diodes D1 and D2, respectively. A second supply current source I2 is situated at the point of connection of the diodes D3, D4, which are also connected back to back. The diodes D1 and D3, and the diodes D2 and D4 thus form respective rectifier chains, the input voltage Vin being applied between the point of connection of the diodes D1 and D3 on the one hand and the point of connection of the diodes D2 and D4 on the other hand. The circuit shown in FIG. 2(a) produces the characteristic seen in FIG. 2(b). FIG. 2(c) shows the resistance as a function of the applied voltage, and the non-linear behavior can clearly be seen in this case.

Figure 3A:
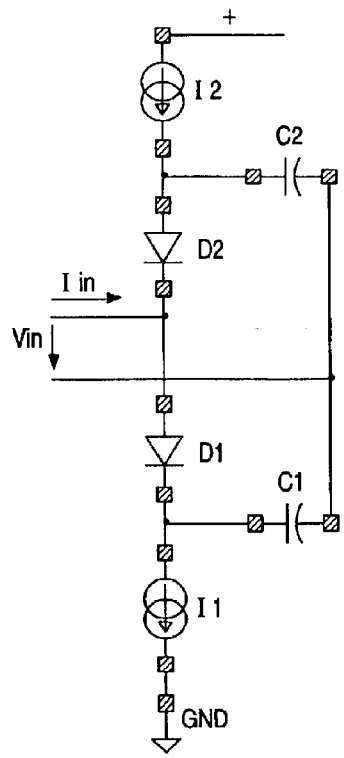
FIG. 3 shows a diode arrangement having capacitor coupling so as to add two alternating signal currents of different d.c. potentials in part (a), the associated characteristic in part (b), and the dependence of the resistance on the voltage in part (c).
Figure 3B:
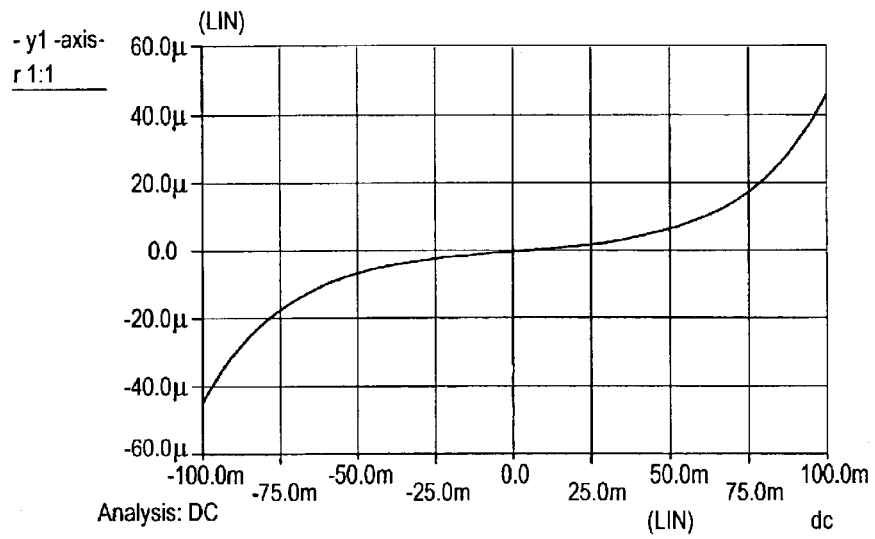
Figure 3C:
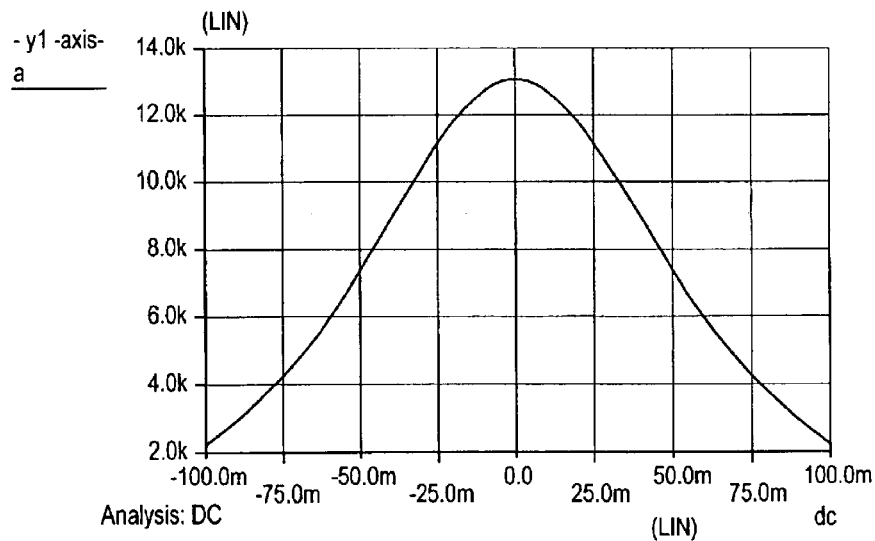

FIG. 3(a) shows a further arrangement for diodes D1 and D2. The two diodes D1, D2 are connected as a series rectifier circuit, one terminal of the resistor being the point of connection of the diodes and the second terminal of the resistor being capacitively connected to the other terminals of the diodes. Because of the use of the capacitor coupling, which is made necessary because of different d.c. voltages, use of this circuit is confined to a.c. voltages. The supply current sources I1, I2 are also coupled in via a corresponding capacitor C1, C2. The associated characteristic is shown in FIG. 3(b) and the variation of the resistance in FIG. 3(c).

Figure 4B:
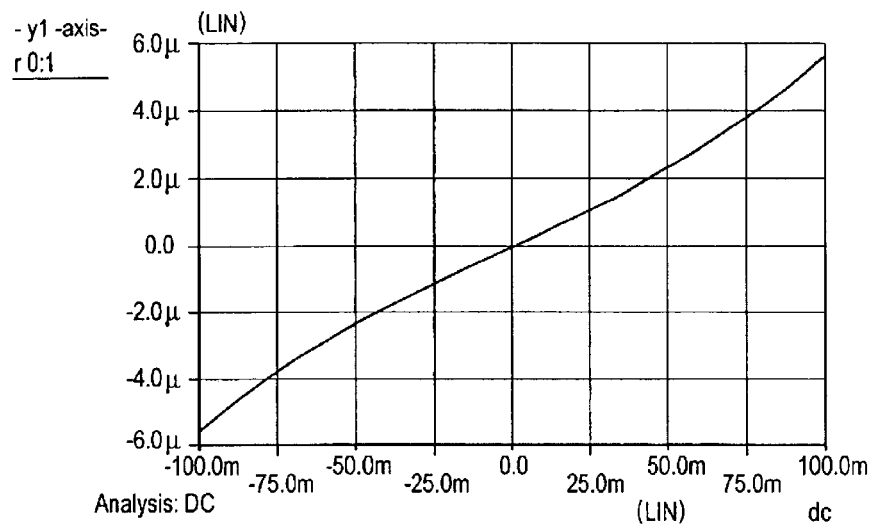

FIG. 4(a) shows a version in which six diodes D1 to D6 are connected as a series rectifier circuit but this arrangement otherwise corresponds to that shown in FIG. 3(a). The slope of the characteristic and the resistance change, as shown in FIG. 4(b) and FIG. 4(c) respectively, in dependence on how many diodes there are in the rectifier chain or series.

Figure 4C:
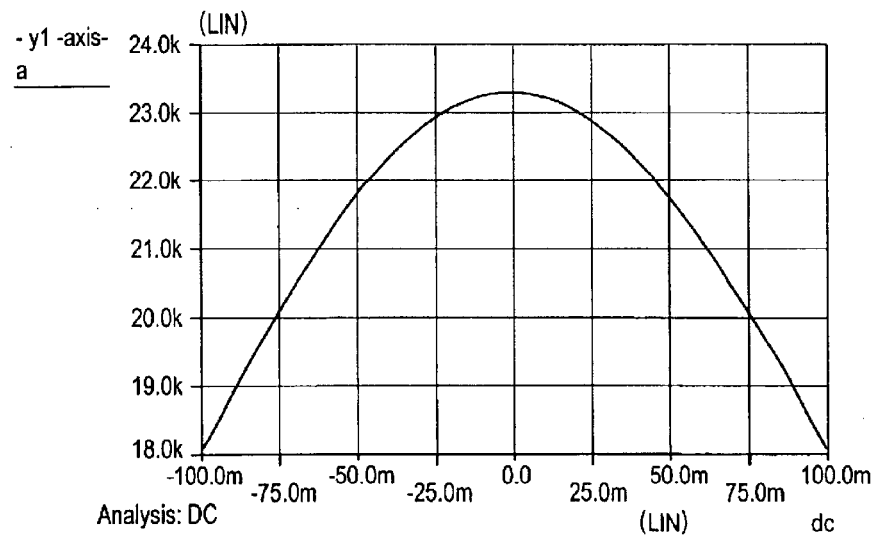
Figure 5A:
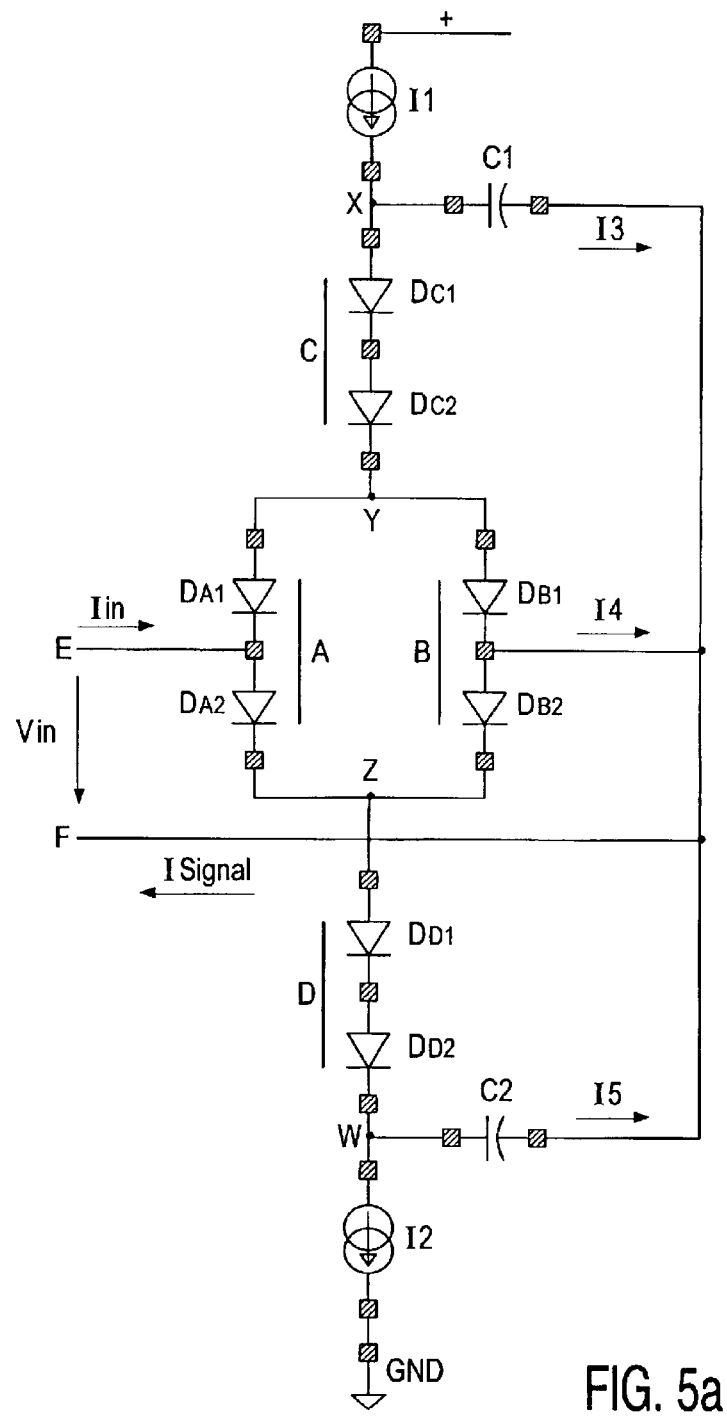

A combination of the circuits from FIG. 2(a) and FIG. 4(a) results in the superimposition of the characteristics from FIG. 2(c) and FIG. 4(c). This enables the curvatures of the characteristics to compensate for one another. An implementation of this combination is shown in FIG. 5(a). The diode arrangement comprises a total of four chains A, B, C, D, each of which comprises two diodes. A third chain C, having two diodes $D_{C1}$, $D_{C2}$ connected one behind the other, is connected to a first common point of connection Y of the two diode chains A and B, the first diode chain A comprising diodes $D_{A1}$ and $D_{A2}$ between which the signal current Iin is applied.

The second chain B comprises two diodes $D_{B1}$ and $D_{B2}$ between which the terminal F of the resistor is situated.

Figure 5B:
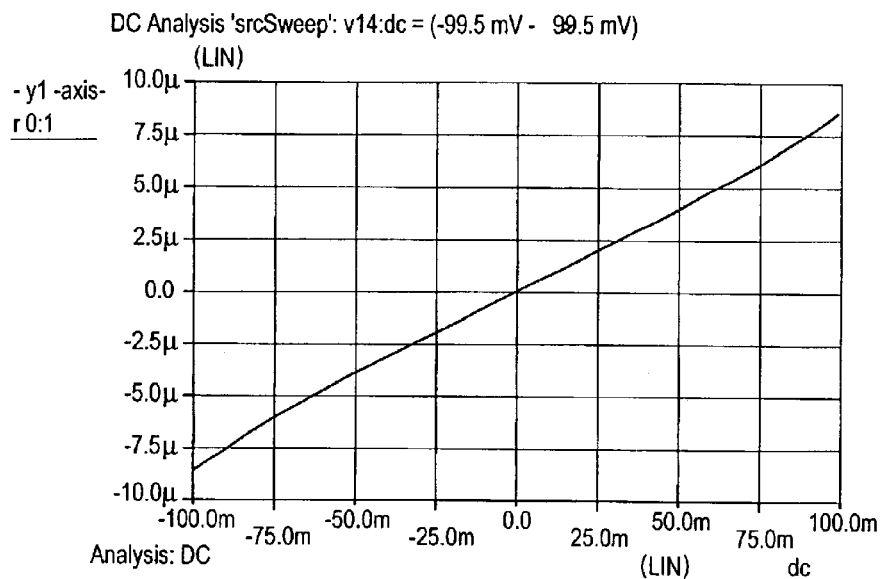
Figure 5C:
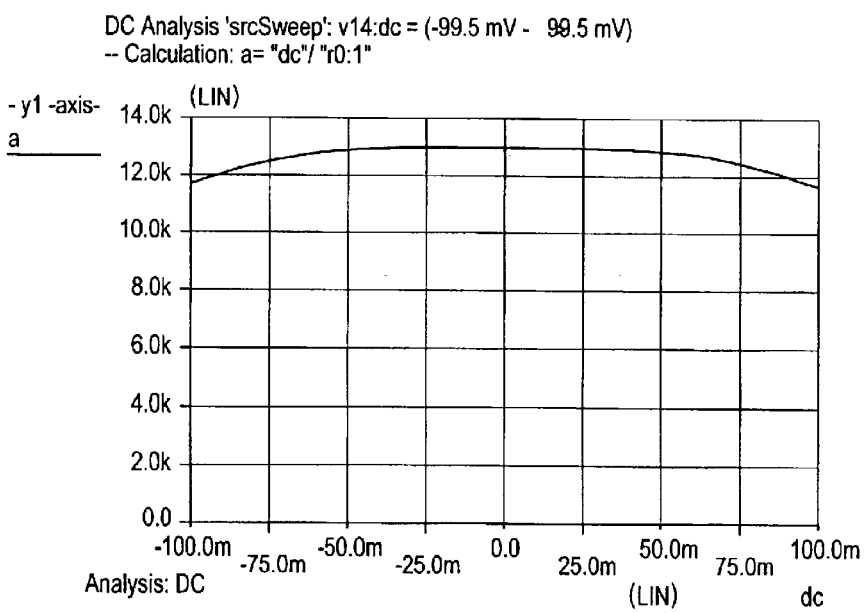

Connected to the second common point of connection Z of the two chains A, B is a fourth chain D, likewise comprising two diodes $D_{D1}$ and $D_{D2}$. The control current I1 is fed to the third diode chain C at the control terminal X and the control current I2 is fed to the fourth diode chain D at the control terminal W. The signal current $I_{signal}$ through the resistor is composed of three components I3, I4 and I5 which, when summed, produce the linearization as a result of the opposing curvatures compensating for one another. The current component I3 flows directly or indirectly towards the resistor terminal F from the control terminal X, and the current component I5 likewise flows directly or indirectly towards resistor terminal F from the control terminal W. The current component I4 flows from the center point of the second chain B directly or indirectly towards the resistor terminal F. To produce behavior that is symmetrical under modulation at the resistor terminals E and F, the two control currents need to be equally large. The characteristic of the circuit of FIG. 5(a) is shown in FIG. 5(b) and the resistance variation, which is now virtually linear, is shown in FIG. 5(c).

The parameters for setting the curvature compensation are the number of diodes in the individual chains A, B, C and D, as shown in FIG. 5(a) for example, and their structure or area factor. It may, for example, also be useful, as shown in FIG. 6, for chain A, for example, to be constructed from a plurality of sub-chains A1, A2, A3 so as to improve the linear behavior still further. In another embodiment, use is made of two triple diodes connected in series.

FIG. 7 shows that it is possible for a resistor that is controlled and linearized in accordance with the invention and of which one terminal F is connected to a voltage supply line, for example (GND in the present case), to be produced with only one control current source. In this embodiment it is preferably the resistor terminal E that is capacitively (C3) connected to the center point of the first diode chain A and resistor terminal F that is capacitively (C4) connected to the center point of the chain B. In other respects, for this arrangement the same applies as was said in relation to FIG. 5(a).

The invention can also be used to produce the change in the properties of the resistor with a deliberate amount of over-compensation or under-compensation. In the examples, the signal current is in each case fed in at a point about which the circuit is symmetrical; an asymmetrical characteristic curve can be obtained by feeding it in at other points.

List of Reference Numerals

| | |
|---|---|
| A | First center chain comprising one or more of the load elements in the arrangement of the non-linear bipolar load elements; this chain is parallel to chain B |
| A1 | Sub-chain of the chain A |
| A2 | Sub-chain of the chain A |
| A3 | Sub-chain of the chain A |
| B | Second center chain comprising one or more of the load elements in the arrangement of the non-linear bipolar load elements; this chain is parallel to the chain A |
| C | Third chain comprising one or more of the load elements in the arrangement of the non-linear bipolar load elements or third diode chain |
| C1 | Capacitor |
| C2 | Capacitor |
| C3 | Capacitive connection of resistor terminal E to the center point of the first diode chain A |
| C4 | Capacitive connection of resistor terminal F to the center point of the second diode chain B |
| D | Chain comprising one or more of the load elements in the arrangement of the non-linear bipolar load elements or fourth diode chain |
| D1 | Diode |
| D2 | Diode |
| D3 | Further diode |
| D4 | Further diode |
| D5 | Diode |
| D6 | Diode |
| $D_{A1}$, $D_{A2}$ ... $D_{Aj}$ | Load elements in chain A |
| $D_{B1}$, $D_{B2}$ ... $D_{Bk}$ | Load elements in chain B |
| $D_{C1}$, $D_{C2}$ ... $D_{Ci}$ | Load elements in chain C |
| $D_{D1}$, $D_{D2}$ ... $D_{Dl}$ | Load elements in chain D |
| E | First resistor terminal |
| F | Second resistor terminal |
| GND | Voltage supply line |
| I1 | Control current source or current source or supply current source or control current |
| I2 | Second supply current source or control current |
| I3 | Current component that contributes to the composition of the signal current through the resistor and which, when summed, produces the linearization as a result of opposing curvatures compensating for one another |
| I4 | Current component that contributes to the composition of the signal current through the resistor and which, when summed, produces the linearization as a result of opposing curvatures compensating for one another |
| I5 | Current component that contributes to the composition of the signal current through the resistor and which, when summed, produces the linearization as a result of opposing curvatures compensating for one another |
| Iin | Input current or signal current |
| $I_{signal}$ | Signal current |
| Vin | Signal voltage or input voltage |
| W | Second control terminal |
| X | First control terminal |
| Y | First common point of connection of the two diode chains A and B |
| Z | Second common point of connection of the two diode chains A and B |

What is claimed is:

1. A circuit arrangement for a current-controlled resistor having an enlarged linear range using an arrangement of non-linear bipolar load elements, having a first resistor terminal (E), a second resistor terminal (F), a first control terminal (X) that is fed by a control current source (I1), and a second control terminal (W), wherein the arrangement of the non-linear bipolar load elements comprises a plurality of chains (A, B, C, D) of load elements comprising one or more of the load elements (D.sub.A1 . . . D.sub.Aj, D.sub.B1 . . . D.sub.Bk, D.sub.C1 . . . D.sub.Ci, and D.sub.D1 . . .

D.sub.D1 respectively) including a first chain of load elements and a last chain of load elements relative to a direction of current flow through the control current source, two of the chains of load elements being center chains (A,B) formed by two parallel chains of load elements situated between the first chain of load elements and the last chain of load elements, wherein one resistor terminal (E,F) is located directly or indirectly at the center of each of the parallel chains (A, B), wherein the two control terminals (X, W) are situated, respectively, at the beginning of the arrangement prior to the first chain of load elements and the end of the arrangement following the last chain of load elements and wherein control terminals (X, W) have a low-resistance connection to one of the resistor terminals (E, F).

2. A circuit arrangement as claimed in claim 1, characterized in that the physical properties of the non-linear bipolar load elements (D.sub.A . . . , D.sub.B . . . , D.sub.C . . . , D.sub.D) are the same in all the chains (A, B, C D).

3. A circuit arrangement as claimed in claim 1, characterized in that the second resistor terminal (F) is connected to the control terminal (X), via a capacitor (C1), between the supply current source (I1) and a chain (C) of load elements preceding the two parallel chains of load elements.

4. A circuit arrangement as claimed in claim 1, characterized in that the second terminal (F) is connected via a second capacitor (C2), to the control terminal (W) of a fourth chain (D) of load elements following the two parallel chains of load elements.

5. A circuit arrangement as claimed in claim 1, characterized in that the number of non-linear bipolar load elements (D.sub.A . . . , D.sub.B . . . , D.sub.C . . . D.sub.D) is selected as a function of the physical properties of the non-linear bipolar load elements.

6. A circuit arrangement as claimed in claim 1, characterized in that at least one of the two parallel chains of load elements (A, B) comprises a plurality of sub-chains (A1, A2, A3) that are connected together in parallel.

7. A circuit arrangement as claimed in claim 1 characterized in that at least one of the two parallel chains of load elements (A, B) comprises triple diodes that are connected in series.

8. A circuit arrangement as claimed in claim 1 characterized in that the non-linear bipolar load element is a semiconductor diode or a transistor diode.

9. A circuit arrangement as claimed in claim 1, characterized in that the second resistor terminal (F) is connected, via one or more capacitors (C1, C2, C4), to at least one of the following: one of the two parallel chains of load elements; a chain of load elements preceding the two parallel chains of load elements; and a chain of load elements following the two parallel chains of load elements (B, C, D).

10. The use of a circuit arrangement as claimed in claim 1 for gain control, as a PIN diode, as a modulator or as a multiplier.

11. A method of controlling a resistor having an enlarged linear range by way of the current, using a circuit arrangement as claimed in claim 1, comprising an arrangement of non-linear bipolar load elements wherein the resistance is generated between a first and a second terminal, having a first resistor terminal (E), a second resistor terminal (F), a first control terminal (X) that is fed by a control current source (I1), and a second control terminal (W), wherein the arrangement of the non-linear bipolar load elements comprises a plurality of chains of load elements (A, B, C, D) comprising one or more of the load elements (D.sub.A1 . . . D.sub.Aj, D.sub.B1 . . . D.sub.Bk, D.sub.C1 . . . D.sub.Ci, and D.sub.D1 . . . D.sub.Dl respectively) including a first chain of load elements and a last chain of load elements relative to a direction of current flow through the control current source, two of the chains of load elements being center chains (A, B) formed by two parallel chains of load elements situated between the first chain of load elements and the last chain of load elements, wherein one resistor terminal (E, F) is located directly or indirectly at the center of each of the parallel chains (A, B), wherein the two control terminals (X, W) are situated, respectively at the beginning of the arrangement prior to the first chain of load elements and the end of the arrangement following the last chain of load elements, and wherein the control terminals (X, W) have a low-resistance connection to one of the resistor terminals (E, F) and linearity of the current-controlled resistor is improved over a range predetermined by the diodes.

* * * * *